United States Patent
Kaewell

(10) Patent No.: US 6,704,380 B1
(45) Date of Patent: Mar. 9, 2004

(54) SYNCHRONIZING PCM AND PSEUDORANDOM CLOCKS

(75) Inventor: John Kaewell, Jamison, PA (US)

(73) Assignee: InterDigital Technology Corporation, Wilmington, DE (US)

(*) Notice: Subject to any disclaimer, the term of this patent is extended or adjusted under 35 U.S.C. 154(b) by 0 days.

(21) Appl. No.: 09/415,322

(22) Filed: Oct. 8, 1999

(51) Int. Cl.$^7$ .................................................. H04L 7/00
(52) U.S. Cl. ........................................................ 375/367
(58) Field of Search .................................. 375/367, 371, 375/326, 376, 145, 149; 370/515, 518

(56) References Cited

U.S. PATENT DOCUMENTS

| | | | | |
|---|---|---|---|---|
| 4,048,563 A | * | 9/1977 | Osborne | 325/58 |
| 4,475,208 A | * | 10/1984 | Ricketts | 375/1 |
| 4,530,103 A | * | 7/1985 | Mosley, Jr. et al. | 375/1 |
| 4,942,590 A | | 7/1990 | Terada | 375/1 |
| 5,003,552 A | | 3/1991 | Mower | 375/1 |
| 5,034,967 A | | 7/1991 | Cox et al. | 375/119 |
| 5,260,969 A | * | 11/1993 | Kato et al. | 375/1 |
| 5,299,229 A | * | 3/1994 | Zscheile, Jr. et al. | 375/1 |
| 5,303,258 A | * | 4/1994 | Nakamura | 375/1 |
| 5,365,543 A | * | 11/1994 | Takahashi et al. | 375/1 |
| 5,815,539 A | * | 9/1998 | Lennen | 375/371 |
| 5,847,678 A | * | 12/1998 | Tachita | 342/357 |
| 5,911,119 A | * | 6/1999 | Bartholomew et al. | 455/402 |
| 5,917,850 A | | 6/1999 | Fujita et al. | 375/200 |
| 6,430,209 B1 | * | 8/2002 | Shigyo et al. | 375/130 |
| 6,452,959 B1 | * | 9/2002 | McDonough | 375/130 |

* cited by examiner

Primary Examiner—Mohammad H. Ghayour
Assistant Examiner—Dung X. Nguyen
(74) Attorney, Agent, or Firm—Volpe and Koenig, P.C.

(57) ABSTRACT

In a system having a received PN clock signal, a method is disclosed for providing a synchronized system clock signal having reduced jitter wherein the synchronized system clock signal is synchronized with the received PN clock signal. The method includes providing a stable high frequency reference signal and dividing the high frequency reference signal to provide a system clock signal having a plurality of system clock phases. The method also includes adjustably selecting a system clock phase of the plurality of system clock phases in accordance with the received PN signal in order to provide the synchronized system clock signal. The received PN clock signal is recovered by providing PN phase adjustments of the received PN clock signal. A tracking control signal is provided in accordance with the PN phase adjustments and the system clock phase is adjustably selected in accordance with the tracking control signal. The high frequency reference signal can be multiplied prior to the dividing.

11 Claims, 3 Drawing Sheets

SYNCHRONIZING PCM AND PSEUDORANDOM CLOCKS

BACKGROUND OF THE INVENTION

1. Field of the Invention

This invention relates to the field of communication systems. In particular, the present invention relates to the providing synchronized clock signals for a plurality of remote devices within a synchronized CDMA communication system.

2. Prior Art

When transmitting information signals between a base station and a plurality of remote network terminals (RNTs) within a synchronous CDMA communication system, the clock signals of the RNTs and the base station of the communication system must be synchronized with each other in order to accurately communicate the information signals. For example, within a synchronous CDMA communication system, whereby each RNT has a 4.096 MHz PCM clock, it is advantageous to synchronize the PCM clock with the very stable pseudorandom number (PN) clock of the base station.

The RNT typically recovers the PN clock signal from a PN signal received with the global pilot signal transmitted by the base station. The RNT may use the recovered PN clock signal as a reference signal to provide synchronization for the PCM clock within the RNT. For example, the recovered PN clock signal may be divided by the processing gain of the system to provide a sixty-four (64) kHz reference signal. The 64 kHz reference signal may then be multiplied by 64 in order to provide the synchronized 4.096 MHz PCM clock required by the RNT for clocking its circuitry.

However, this approach requires a significant amount of extra circuitry within the RNT in order to recover the clock signal for use by the RNT and perform the required operations upon the recovered clock signal. Furthermore, this approach requires frequency multiplication operations to provide the desired frequencies. Since these frequency multiplication operations cause any noise present in the multiplied signal to be multiplied along with the frequency of the signal, the clock signal provided by this approach could include a substantial amount of jitter. Furthermore, if constant phase adjustments of the reference clock are required to compensate for frequency wandering of the reference clock, further jitter may be introduced into the reference clock signal.

Accordingly, it would be desirable to provide a clock signal within an RNT of a communication system that is synchronized to the PN clock of the base station whereby the synchronized clock signal provided in this manner has low jitter and does not require substantial additional circuitry.

SUMMARY OF THE INVENTION

In a CDMA communication system having a received PN clock signal, a method is disclosed for providing a synchronized system clock signal having reduced jitter wherein the synchronized system clock signal is synchronized with the received PN clock signal. The method includes providing a stable high frequency reference signal and dividing the high frequency reference signal to provide a system clock signal having a plurality of system clock phases. The method also includes adjustably selecting a system clock phase of the plurality of system clock phases in accordance with the received PN signal to provide the synchronized system clock signal. The received PN clock signal is recovered by providing PN phase adjustments of the received PN clock signal. A tracking control signal is provided in accordance with the PN phase adjustments and the system clock phase is adjustably selected in accordance with the tracking control signal. The high frequency reference signal can be multiplied prior to the dividing.

DETAILED DESCRIPTION OF THE INVENTION

Figure 1:
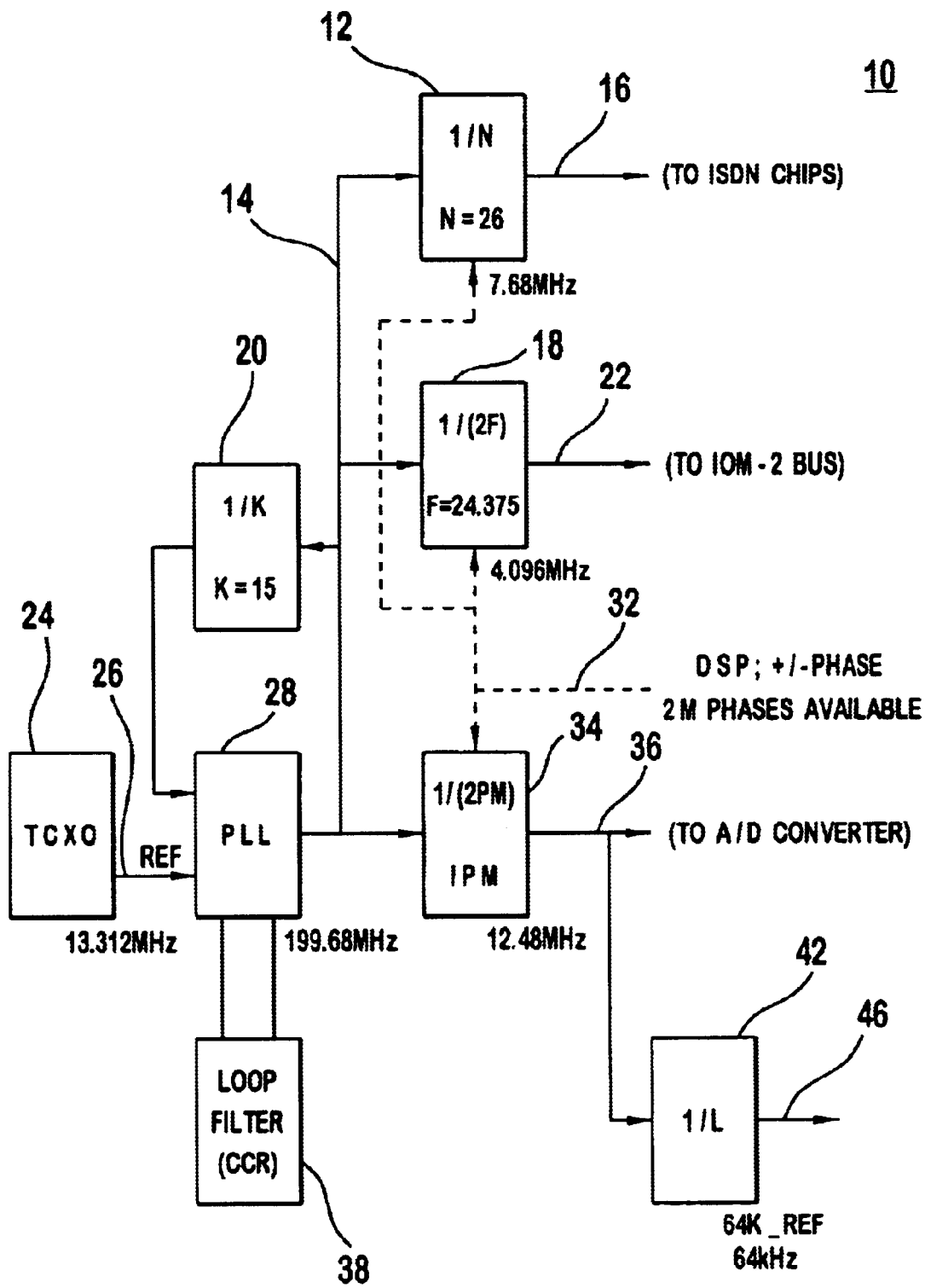
FIG. 1 shows a clock generation system for providing reference clock signals within a base station or an RNT of a mobile CDMA communication system in accordance with the method of the present invention.

The present invention will be explained with reference to the drawing figures where like numerals represent like elements throughout.

Referring now to FIG. 1, there is shown a clock generation system 10. The clock generation system 10 provides clock signals for use within a base station or an RNT of a mobile CDMA communication system. Within the clock generation system 10, a temperature compensated crystal oscillator 24 generates a stable reference clock signal on system clock line 26. The reference clock of the temperature compensated crystal oscillator 24 should be a very stable signal. In one preferred embodiment of the clock generation system 10, the temperature compensated crystal oscillator (TCXO) 24 provides a 13.312 MHz clock signal.

The reference clock of system clock line 26 is applied to the phase-locked loop 28. The frequency synthesis performed by the phase-locked loop 28 provides an output signal having a frequency sixteen (16) times the frequency of the reference clock of the system clock line 26. This provides high resolution for permitting adjustment of the decoding within the RNT to the correct received phase when synchronizing the RNT with the base station. The phase-locked loop 28 may include a phase comparator and a digital oscillator. Additionally, the phase-locked loop 28 may have loop filter 38. The loop filter 38 smooths out the error signal from the phase comparator. This filtered error signal causes a more stable output from the oscillator.

The synthesized output signal of the phase-locked loop 28 is provided on a voltage controlled oscillator (VCO) clock line 14. The clock signal of the VCO clock line 14 is fed back to a second input of the phase-locked loop 28 by way of a programmable feedback block 20 in order to permit programmable adjustment of the output frequency of the phase-locked loop 28. In the programmable feedback block 20, the signal of VCO clock line 14 is divided by a factor of K prior to application of the input to the phase-locked loop 28, (where K is a programmable integer value).

The clock signal of the VCO clock line 14 is also applied to an incremental phase modulator 34. The incremental phase modulator 34 divides the VCO clock signal by a factor of 2PM and provides the main clock signal output 36 of the clock generation system 10. Within the incremental phase modulator 34, a total of 2M different phases of the chip clock signal are available when the division of the clock signal of the VCO clock line 14 is performed in this manner. For example, in a preferred embodiment, the value of PM may be twelve (12) or sixteen (16). The main clock signal, (or chip clock signal), appears on the main clock signal output line 36 which is used to clock the analog-to-digital (A/D) converters (not shown) of the circuitry within the RNT.

Within the clock generation system 10, a digital signal processor (DSP) is provided in a conventional manner. A DSP is a specialized microprocessor which typically contains high-speed mathematical circuits, such as multipliers and adders. These circuits are useful for the processing of digital signals such as voice, music or modem waveforms. In accordance with the present invention, the DSP performs a number of operations including the PN code tracking required within the CDMA communication system. The PN code tracking operations include adjusting the phase of a recovered PN clock whenever it leads or lags by more than a predetermined amount. These PN phase adjustments are used in synchronizing the clock signals of the clock generator system 10. For example, information concerning PN phase adjustments made by the DSP can be used to select the phase of the chip clock on the main clock signal output line 36. These phase adjustments are performed by providing a tracking control signal from the DSP that is representative of the phase adjustments of the PN clock. The tracking control signal provided in this manner can then be used to adjust the value of PM within the incremental phase modulator 34. This permits advancing or retarding the clock of the main clock signal output line 36 according to the phase adjustments of the recovered PN clock, and substantially reduces the jitter of the clock signal of the main clock signal output line 36.

The tracking control signal is obtained from a received global pilot signal and applied to the incremental phase modulator 34 by way of the DSP clock control line 32. The signal on the DSP clock control line 32 can indicate selection of + or − a phase of the available phases within the incremental phase modulator 34. These phase adjustments can be performed during the "wake up" periods of the RNT, as would be understood by those of skill in the art.

The signal of the main clock signal output line 36 is applied to a division block 42 in order to provide a further reference clock signal on the clock output line 46. The clock signal on the clock output line 46 is determined by dividing the signal of main clock signal output line 36 by a factor of L.

In accordance with the present invention, the clock signal of the VCO clock line 14 is also used to generate the 4.096 MHz PCM clock of the RNT. In order to provide the PCM signal, the VCO clock line 14 is applied to a clock divider circuit 18 which performs the division required to provide the 4.096 MHz PCM clock signal on the clock output line 22. For example, the PCM clock signal of the VCO clock line 14 can be divided by a factor of 2F within the clock divider circuit 18, where F may have a value of 24.375. The signal of clock output line 22 is then used by an IOM-2 bus. The IOM-2 bus is a standardized telecom bus which provides a common interface to permit different devices of different companies to work together.

In the preferred embodiment of the present invention, the generation of the 4.096 MHz clock signal by the clock divider circuit 18 is a two-step process. In the first step, an intermediate clock signal having twice the required rate is provided. In the second step, the intermediate clock signal is divided in half. This is done to achieve a near 50% duty-cycle. The division performed by the clock divider circuit 18 can be a non-integer division performed using two different end counts in a division counter. Furthermore, the division can provide a plurality of phases as previously described with respect to the plurality of phases provided within the incremental phase modulator 34. Thus, in order to synchronize the 4.096 MHz signal to the PN clock, the divider circuit 18 is also controlled by the tracking control signal provided by the DSP by way of the DSP clock control line 32. The tracking control signal adjustably selects the available phases within the clock division circuit 18.

A further clock signal can be output by the clock generation system 10 via a clock divider circuit 12. The clock divider circuit 12 receives the clock signal of the VCO clock line 14 and divides it by a factor of N, where N can be an integer or a non-integer value. For example, N has a value of twenty-six (26) in order to provide a signal on clock output line 16 having a frequency of 7.68 MHz. The division within the clock division circuit 12 can also be performed as a two-step process and can provide a plurality of selectable phases. Thus, the DSP can adjustably select the output phase of the clock divider circuit 12 by way of the DSP clock control line 32. The signal output on clock output line 16 can be applied to ISDN chips within the RNT. Accordingly, if the ISDN chips require a synchronized 7.68 MHz clock-signal, this output will provide that signal. This permits the RNT to support ISDN equipment that the end user may connect to the RNT.

In the preferred embodiment of the invention, all of the elements of the clock generation system 10 described above are formed on an ASIC except the TCXO 24 and the loop filter 38. In this embodiment of the invention, each of the above clock signals required by the RNT is generated within the ASIC based upon the reference clock of the system clock line 26. Each of the clock signals generated in this manner is then provided by the ASIC for use by the circuitry of the RNT.

The values of the parameters described above with respect to the clock generation system 10 are set forth for selected bandwidths in Table I. The values set forth for the fifteen MHz bandwidth within Table I are provided as reference values.

TABLE I

| Bandwidth (MHz) | PN_ck (MHz) | Vco_ck (MHz) | Tcxo_ck (MHz) | P | M | K | L (processing gain to 64k) | F | N |
|---|---|---|---|---|---|---|---|---|---|
| 20 | 16.64 | 199.68 | 13.312 | 1 | 6 | 15 | 260 | 24.375 | 26 |
| 15 | 12.48 | 199.68 | 13.312 | 1 | 8 | 15 | 195 | 24.375 | 26 |

TABLE I-continued

| Bandwidth (MHz) | PN_ck (MHz) | Vco_ck (MHz) | Tcxo_ck (MHz) | P | M | K | L (processing gain to 64k) | F | N |
|---|---|---|---|---|---|---|---|---|---|
| 14 | 11.648 | 186.368 | 13.312 | 1 | 8 | 14 | 182 | 22.75 | −24.267 |
| 10.5 | 8.512 | 204.277 | 17.024 | 2 | 6 | 12 | 133 | 24.9375 | −26.6 |
| 10 | 8.32 | 199.68 | 13.312 | 2 | 6 | 15 | 130 | 24.375 | 26 |
| 7 | 5.824 | 186.368 | 13.312 | 2 | 8 | 14 | 91 | 22.75 | −24.267 |
| 5 | 4.16 | 199.68 | 13.312 | 3 | 8 | 15 | 65 | 24.375 | 26 |
| 3.5 | 2.88 | 184.32 | 15.36 | 4 | 8 | 12 | 45 | 22.5 | 24 |

Figure 2:
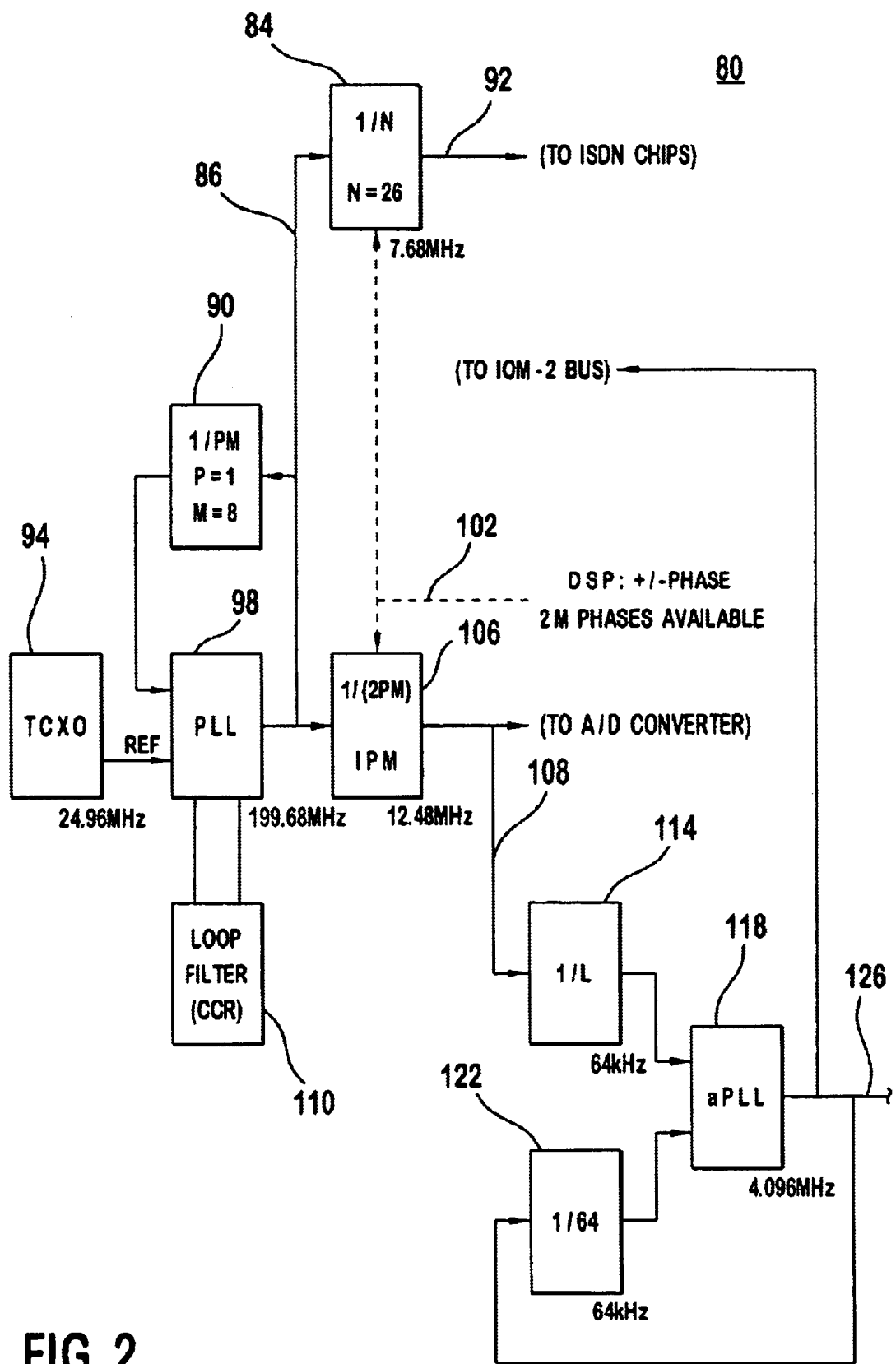
FIG. 2 shows an alternative embodiment of the clock generation system of FIG. 1 for providing reference clock signals within a base station or an RNT of a mobile CDMA communication system in accordance with the method of the present invention.

Referring now to FIG. 2, there is shown an alternative embodiment of the present invention. This alternative embodiment of the clock generation system 80 is suitable for use within a base station or an RNT of a mobile communication system. In this preferred embodiment, all of the elements of clock generation system 80 are formed on an ASIC except the TCXO 94, the loop filter 110, the phase-locked loop 118, and the feedback block 122 of phase-locked loop 118. Components 94, 110, 118, and 122 of clock generation system 80 can be provided as discrete components external to the ASIC.

The external components 118, 122 receive a 64 kHz reference signal from the ASIC provided in accordance with the phase selection method of the present invention. The 64 kHz reference signal provided in this manner by the internal components of the ASIC is used by the external components 118, 122 to produce the required 4.096 MHz clock signal in a conventional manner.

The clock generation system 80 also includes a TCXO 94 which applies a stable reference clock signal to the phase-locked loop 98. Preferably, the reference clock signal from the TCXO 94 is a 24.96 MHz system clock signal. The phase-locked loop 98 can be a digital phase-locked loop having a loop filter 110. A frequency synthesis is performed within the phase-locked loop 98, in a manner well known to those skilled in the art, to provide a signal having a frequency that is a multiple of the reference signal of the TCXO 94, such as 199.68 MHz.

The synthesized output signal of the phase-locked loop 98 is a clock signal that is provided on the VCO clock line 86. This VCO clock signal 86 is fed back to an input of the phase-locked loop 98 by way of a programmable feedback block 90 to control the output frequency of phase-locked loop 98. Within the feedback block 90 the signal of the VCO clock line 86 is divided by a factor of PM prior to application to the input of the phase-locked loop 98.

The clock signal of the VCO clock line 86 is also applied to an incremental phase modulator 106 which divides the clock signal by a factor of 2PM to provide a plurality of phases of a chip rate clock signal. A selected phase of the plurality of phases of the chip rate clock signal is available on the clock line 108. The frequency of the chip rate clock signal of clock line 108 is one-half the frequency of the reference clock signal provided by the TCXO 94.

Generation of the VCO clock signal of the clock line 108 is performed in this manner under the control of the DSP by way of a DSP clock control line 102. This permits the adjustable selection of one of the phases available within the incremental phase modulator 106. The incremental phase modulator 106 applies the selected chip rate clock signal to other components of the RNT, such as A/D converters, (not shown), by way of the clock output line 108.

The clock signal of the clock output line 108 is also used to generate a 4.096 MHz signal on the clock line 126. In order to generate the 4.096 MHz signal, the clock output line 108 is applied to a division block, such as division block 114, whereby the clock signal is divided by a factor of L, (where L is the processing gain). The divided clock signal of the division block 114 determined in this manner is applied to an input of the phase-locked loop 118 in order to provide a reference for the phase-locked loop 118.

The signal of the clock output line 126 is fed back to the remaining input of the phase-locked loop 118 by way of a feedback block 122. In the feedback block 122, the signal of output clock line 126 is divided by a factor of sixty-four (64). The 4.096 MHz signal of clock output line 126 may be applied to an IOM-2 Bus.

Additionally, a clock signal is output by the clock generation system 80 via a clock divider circuit 84. The clock divider circuit 84 receives the signal from clock line 86 and provides a 7.68 MHz clock signal on the clock output line 92. The signal of the clock output line 92 is formed by dividing the frequency of the clock signal of clock line 86 by a factor of N under the control of the DSP by way of the DSP clock control line 102. The division by N can be performed as a two-step process as previously described. The signal of clock output line 92 is then applied to ISDN chips within the RNT.

Thus, in alternate embodiments of the present invention, the 4.096 MHz PCM clock signal can be generated either internally within the ASIC or by applying a 64 kHz clock signal provided by the ASIC to the phase-locked loop 118 external to the ASIC. In either case, the resulting 4.096 MHz clock is synchronized with the PN clock using a tracking control signal and is provided with low jitter. While it is believed that it is generally preferable to produce the 4.096 MHz clock internal to the ASIC, as set forth in the clock generator system 10, the results provided by the external phase-locked loop method of clock generator system 80 are acceptable.

The jitter produced by using the PN tracking control code to adjustably select the phase of incremental phase modulator 106 within clock generation system 80 are set forth for selected bandwidths in Table II.

TABLE II

| Bandwidth (MHz) | Vco_ck (MHz) | 8.192 MHz nominal divide factor | Adjustment (+/−P periods of VCO clock) | Peak jitter due to IPM tracking (ns) = (2P − 1) $T_{VCO}$ |
|---|---|---|---|---|
| 20 | 199.68 | 24.375 | +/−1 | $T_{VCO}$ = 5.0 |
| 15 | 199.68 | 24.375 | +/−1 | $T_{VCO}$ = 5.0 |
| 14 | 186.368 | 22.75 | +/−1 | $T_{VCO}$ = 5.3 |
| 10.5 | 204.277 | 24.9375 | +/−2 | $3*T_{VCO}$ = 14.7 |
| 10 | 199.68 | 24.375 | +/−2 | $3*T_{VCO}$ = 15.0 |
| 7 | 186.368 | 22.75 | +/−2 | $3*T_{VCO}$ = 16.0 |

TABLE II-continued

| Bandwidth (MHz) | Vco_ck (MHz) | 8.192 MHz nominal divide factor | Adjustment (+/−P periods of VCO clock) | Peak jitter due to IPM tracking (ns) = (2P − 1) $T_{VCO}$ |
|---|---|---|---|---|
| 5 | 199.68 | 24.375 | +/−3 | 5*$T_{VCO}$ = 25.0 |
| 3.5 | 184.32 | 22.5 | +/−4 | 7*$T_{VCO}$ = 38.0 |

Figure 3:
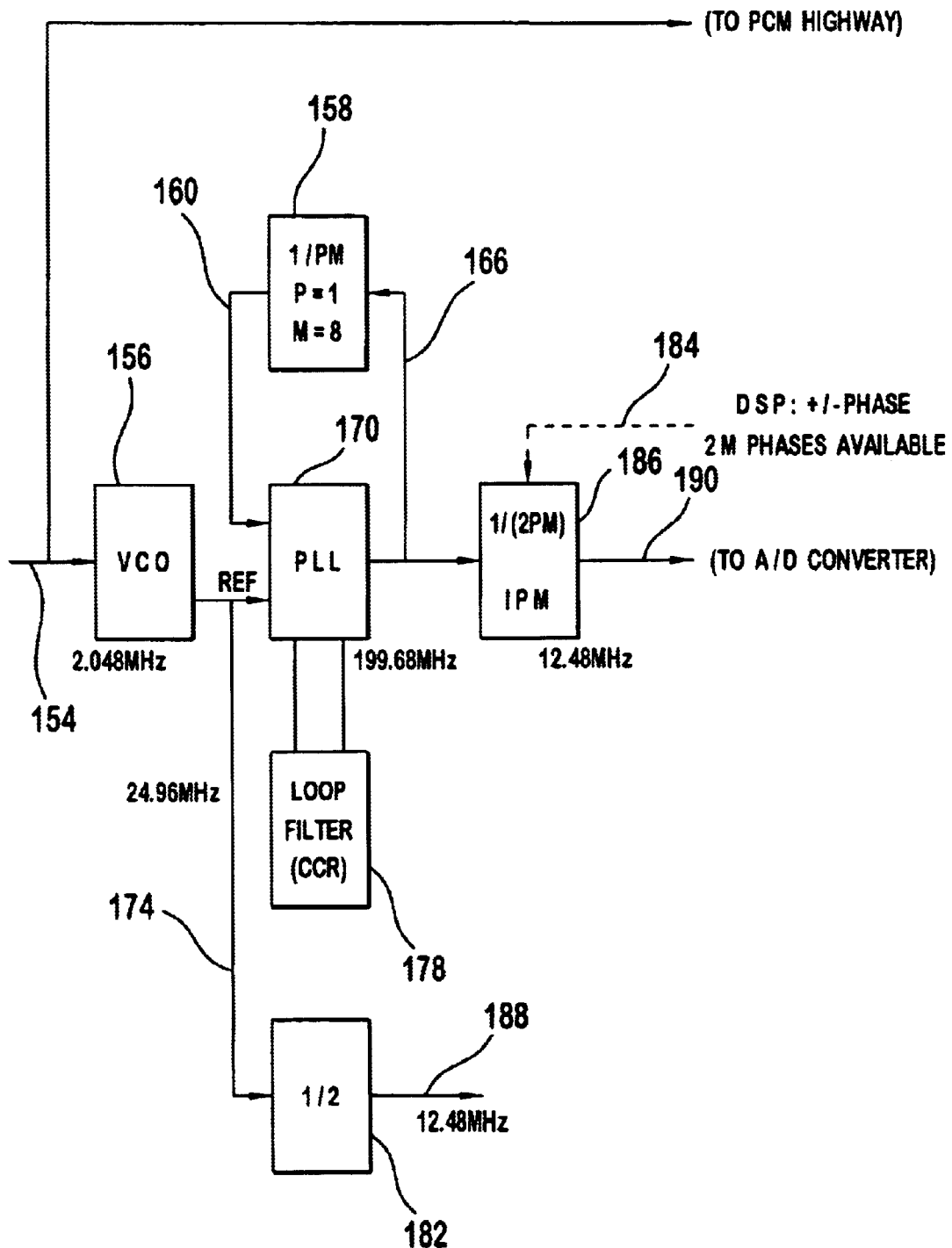
FIG. 3 shows a second alternative embodiment of the clock generation system of FIG. 1 for providing reference clock signals within a base station or an RNT of a mobile communication system in accordance with the method of the present invention.

Referring now to FIG. 3, there is shown a second alternative embodiment of the clock generator system 150 of the present invention. In this embodiment, the clock generator system 150 accepts an input PCM clock signal by way of input clock line 154 via a VCO 156. The PCM clock signal is also fed to a PCM highway by way of the input clock line 154. The VCO 156 multiplies the input PCM clock signal and applies the resulting system reference clock signal to the phase-locked loop 170 by way of a system clock line 174. The input PCM clock signal preferably has a frequency of 2.048 MHz and the VCO 156 multiplies the frequency of the input PCM clock signal to 24.96 MHz. The 24.96 MHz signal at the output of the VCO 156 is twice the PN rate of the RNT. If desired, the phase-locked loop 170 can also be provided with a loop filter 178.

The phase-locked loop 170 receives the output signal of the VCO 156 and performs a frequency synthesis in a manner well known to those skilled in the art. The output signal of the phase-locked loop 170 is fed back to a second input of the phase-locked loop 170 by way of the VCO clock line 166 and a feedback block 158. In the feedback block 158, the output signal of the phase-locked loop 170 is divided by a factor of PM. The output of feedback block 158 is applied to the input of the phase-locked loop 170 by way of the feedback line 160. P can have a value of one (1) and M can have a value of eight (8) in one embodiment of the present invention.

The output signal of the phase-locked loop 170 is applied to an incremental phase modulator 186 which divides the signal received from the phase-locked loop 170 by a factor of 2PM and provides a plurality of selectable phases of the divided signal as previously described with respect to the incremental phase modulators 34, 106 of the aforementioned embodiments. Thus, the output phase of the incremental phase modulator 186 is adjustable under the control of the DSP by way of the DSP clock control line 184 as also previously described. The divided output signal of the incremental phase modulator 186 is applied by way of the output line 190 to clock other components within the RNT, such as A/D converters (not shown).

Additionally, a clock signal is provided by the clock divider circuit 182, which receives the signal of the system clock line 174 and provides a PN clock signal on the clock output line 188. The clock signal of the clock output line 188 is formed by dividing the frequency of the clock signal of the clock line 174 by a certain factor, such as a factor of two in a preferred embodiment of the invention. It will be understood that the phases of the clock signal of the clock output line 188 are not adjustably selected in accordance with this embodiment of the present invention.

In this embodiment of the invention all of the components of the clock generation system 150 are formed on an ASIC with the exception of the VCO 156 and the loop filter 178. These components 156, 178 may be provided as discrete components external to the ASIC.

It should be understood by those skilled in the art that two general sources of jitter affect the 4.096 MHz clock of the clock generation system 10. One source of jitter is the non-integer division of clock divider block 18. This jitter $T_{VCO}$, is caused by the use of a counter with two different end counts as required for non-integer division for most frequencies. For example, in order to obtain a value of F=24.375, end counts of twenty-four (24) and twenty-five (25) must be used. This source of jitter can result in a nominal jitter equal to the period of the counter clock, which is approximately five nanoseconds.

The other source of the jitter of the 4.096 MHz clock is the tracking of the PN phase according to the tracking control signal of the DSP clock control line 32. This jitter is additive with the jitter due to non-integer division of the clock divider block 18. As previously described, both the clock division circuit 12 and the clock division circuit 18 produce clock signals that are locked to the PN clock when they are incrementally phase modulated. Additionally, in the two-step division process of both clock division circuits 12, 18, the high frequency clock signal of the input is divided by a nominal non-integer value as shown in Table II. A divide-by-two circuit is then used to generate a fifty percent (50%) duty cycle clock. The tracking control signal of clock control line 32 is used to determine whether the nominal divide values must be modified in order to maintain synchronization. In order to minimize jitter and glitches, the modification of the divide values is done in a synchronous manner.

The peak jitter can be determined by adding or subtracting the adjustment factor of each of the divide sequences and calculating the variation of the clock pulse due to the extension or truncation caused by the adjustment. Since the number of available phases of the PN clock is 2M, and the clock is generated by a 1/2PM divider in the incremental phase modulator 34, the adjustment in the phase of the PN clock is +/−P*$T_{VCO}$. Thus, when it is required, the counter of divider block 18 does not stop at the nominal end count. Rather, it stops at the nominal end count plus or minus P. At the output of the divide-by-two counter of divider block 18 the jitter can be 2P periods of the VCO clock, even though the adjustment compensates for the jitter due to the non-integer division. This results in a maximum jitter of 2*P*$T_{VCO}$. Thus the jitter added due to the tracking is at most (2P−1)$T_{VCO}$.

The jitter of the 4.096 MHz clock signal due to each of the two sources of jitter is set forth with respect to selected bandwidths in Table III. Additionally, the maximum jitter for each bandwidth is set forth in Table III.

TABLE III

| Bandwidth (MHz) | Nominal jitter due to non-integer division (ns) | Peak jitter due to IPM tracking (ns) | Max jitter on 4.096 MHz clock signal (ns) |
|---|---|---|---|
| 20 | $T_{VCO}$ = 5.0 | (2P − 1) $T_{VCO}$ = 5.0 | (2P) $T_{VCO}$ = 10.0 |
| 15 | 5.0 | 5.0 | 10.0 |
| 14 | 5.4 | 5.3 | 10.7 |
| 10.5 | 4.9 | 14.7 | 19.6 |
| 10 | 5.0 | 15.0 | 20.0 |
| 7 | 5.4 | 16.0 | 21.4 |
| 5 | 5.0 | 25.0 | 30.0 |
| 3.5 | 5.4 | 38.0 | 43.4 |

While specific embodiments of the present invention have been shown and described, many modifications and variations could be made by one skilled in the art without departing from the spirit and scope of the invention. The above description serves to illustrate and not limit the particular form in any way.

What is claimed is:

1. In a system having a received pseudorandom number (PN) clock signal, a method for providing a synchronized system clock signal having reduced jitter, said synchronized system clock signal being synchronized with said PN clock signal, the method comprising the steps of:
   providing a stable high frequency reference signal;
   dividing said high frequency reference signal to provide a system clock signal having a plurality of system clock phases;
   adjustable selecting a system clock phase of said plurality of system clock phases in accordance with the PN signal in order to provide said synchronized system clock signal;
   multiplying said high frequency reference signal prior to dividing said high frequency reference signal, wherein said high frequency reference signal is multiplied using a frequency synthesizer.

2. In a system that receives a pseudorandom number (PN) clock signal, a method for providing a synchronized system clock signal having reduced jitter, said synchronized system clock signal being synchronized with said PN clock signal, the method comprising the steps of:
   outputting a stable high frequency reference signal from a phase-locked loop;
   dividing said stable high frequency reference signal to provide an adjustment signal used by said phase-locked loop to adjust the frequency of said reference signal;
   dividing said high frequency reference signal to provide a system clock signal having a plurality of system clock phases;
   providing PN phase adjustments of said PN clock signal;
   providing a tracking signal control signal in accordance with said PN phase adjustments; and
   adjustably selecting a system clock phase of said plurality of system clock phases in accordance with said tracking control signal in order to provide said synchronized system clock signal.

3. The system of claim 2 further comprising means for multiplying said high frequency reference signal prior to dividing said high frequency reference signal.

4. The system of claim 3 wherein said high frequency reference signal is multiplied using a frequency synthesizer.

5. The system of claim 2 wherein said high frequency reference signal is provided using a temperature compensated crystal oscillator.

6. A communication system for providing a synchronized system clock signal having reduced jitter, said system receiving a pseudorandom number (PN) clock signal, said synchronized system clock signal being synchronized with said PN clock signal, the system comprising:
   a phase-locked loop for outputting a stable high frequency reference signal;
   means for dividing said high frequency reference signal to provide an adjustment signal used by said phase-locked loop to adjust the frequency of said reference signal;
   means for dividing said high frequency reference signal to provide a system clock signal having a plurality of system clock phases;
   means for providing PN phase adjustments of said PN clock signal;
   means for providing a tracking signal control signal in accordance with said PN phase adjustments; and
   means for adjustably selecting a system clock phase of said plurality of system clock phases in accordance with said tracking control signal in order to provide said synchronized system clock signal.

7. A communication system for providing a synchronized system clock signal having reduced jitter, said system having a received pseudorandom number (PN) clock signal, said synchronized system clock signal being synchronized with said PN clock signal, the system comprising:
   a stable oscillator which generates a stable reference clock signal having a first frequency;
   a phase-locked loop in communication with the stable oscillator, the phase-locked loop receiving the stable reference clock signal and outputting a synthesized clock signal having a second frequency that is a multiple of the first frequency;
   an incremental phase modulator in communication with the phase-locked loop, the incremental phase modulator dividing said synthesized clock signal outputted by said phase-locked loop to provide a system clock signal having a plurality of system clock phases; and
   a processor in communication with the incremental phase modulator, the processor adjusting the phase of the PN clock signal and selecting a system clock phase of said plurality of system clock phases in accordance with the PN signal.

8. The system of claim 7 further comprising:
   a programmable feedback block in communication with the phase-locked loop, the programmable feedback block dividing said synthesized clock signal and feeding the divided synthesized clock signal back to an input of the phase-locked loop to provide an adjustment signal used by said phase-locked loop to adjust the frequency of said outputted synthesized clock signal.

9. The system of claim 7 wherein said processor is a digital signal processor (DSP) used to perform PN code tracking operations including adjusting the phased of the PN clock whenever it leads or lags by more than a predetermined amount.

10. In a system having a received pseudorandom number (PN) clock signal, a method for providing a synchronized system clock signal having reduced jitter, said synchronized system clock signal being synchronized with said PN clock signal, the method comprising the steps of:
   generating a stable reference clock signal having a first frequency;
   receiving the stable reference clock signal and outputting a synthesized clock signal having a second frequency that is a multiple of the first frequency;
   dividing said synthesized clock signal to provide a system clock signal having a plurality of system clock phases; and
   adjusting the phase of the PN clock signal and selecting a system clock phase of said plurality of system clock phases in accordance with the PN signal.

11. The method of claim 10 further comprising:
   dividing said synthesized clock signal to provide an adjustment signal used to adjust the frequency of said synthesized clock signal.

* * * * *

UNITED STATES PATENT AND TRADEMARK OFFICE
CERTIFICATE OF CORRECTION

PATENT NO.   : 6,704,380 B1
DATED         : March 9, 2004
INVENTOR(S) : John Kaewell It is certified that error appears in the above-identified patent and that said Letters Patent is hereby corrected as shown below:

Column 9,
Line 11, delete "adjustable" and insert -- adjustably --.

Column 10,
Line 39, after first occurrence of "the", delete "phased" and insert -- phase --.

Signed and Sealed this

Twenty-first Day of February, 2006

JON W. DUDAS
*Director of the United States Patent and Trademark Office*